United States Patent
Uvieghara

(10) Patent No.: US 6,998,895 B2
(45) Date of Patent: Feb. 14, 2006

(54) SYSTEM FOR REDUCING LEAKAGE IN INTEGRATED CIRCUITS DURING SLEEP MODE

(75) Inventor: Gregory A. Uvieghara, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 76 days.

(21) Appl. No.: 10/643,283

(22) Filed: Aug. 18, 2003

(65) Prior Publication Data

US 2004/0095176 A1 May 20, 2004

Related U.S. Application Data

(60) Provisional application No. 60/422,367, filed on Oct. 29, 2002.

(51) Int. Cl.
G05F 1/10 (2006.01)

(52) U.S. Cl. .................. 327/202; 327/203; 327/544
(58) Field of Classification Search .......... 327/202, 327/309, 544, 203
See application file for complete search history.

(56) References Cited

U.S. PATENT DOCUMENTS

| | | | |
|---|---|---|---|
| 5,675,272 A | 10/1997 | Chu | |
| 5,703,500 A | 12/1997 | Vo | |
| 5,973,529 A | * 10/1999 | Chappell et al. | 327/200 |
| 6,191,606 B1 | 2/2001 | Ye et al. | |
| 6,275,083 B1 | 8/2001 | Martinez et al. | |
| 6,337,583 B1 | 1/2002 | Ooishi et al. | |
| 6,437,623 B1 | * 8/2002 | Hsu et al. | 327/202 |

* cited by examiner

Primary Examiner—Kenneth B. Wells
(74) Attorney, Agent, or Firm—Philip R. Wadsworth; Charles D. Brown; Nicholas J. Pauloy

(57) ABSTRACT

A system for reducing current leakage in an integrated circuit. The system includes a first circuit component and a second circuit component in a path between a high voltage state and a low voltage state, such as ground. A feedback mechanism selectively provides feedback from an output of the second circuit component to an input of the first circuit component to selectively cutoff the path at the first circuit when the path is not cutoff at the second circuit. In a more specific embodiment, feedback mechanism preserves data in the integrated circuit via a multiplexer that selectively enables the feedback when the integrated circuit is in sleep mode. The first and second circuit components are High Voltage Threshold (HVT) CMOS inverters. The feedback path is chosen so that when the feedback path is activated, leakage paths through the CMOS inverters are cutoff.

23 Claims, 6 Drawing Sheets

SYSTEM FOR REDUCING LEAKAGE IN INTEGRATED CIRCUITS DURING SLEEP MODE

RELATED APPLICATIONS

This application claims priority to U.S. Provisional Application No. 60/422,367, filed on Oct. 29, 2002.

BACKGROUND OF THE INVENTION

1. Field of Invention

This invention relates to integrated circuits. Specifically, the present invention relates to systems for preventing or reducing leakage in synchronous digital systems during sleep mode.

2. Description of the Related Art

Integrated circuits are employed in various demanding applications including personal computers, cellular telephones, watches, and finite state machines. Such applications demand high-performance integrated circuits that exhibit minimal current leakage when idle or in sleep mode. Current leakage is particularly problematic in mobile applications, such as cellular telephones, laptops, and personal digital assistants, where long battery life is desirable.

These applications often employ synchronous digital systems implemented via integrated circuits. Synchronous digital systems employ synchronizing clocks to properly sequence circuit operations. Power consumption and performance of a synchronous digital system depends on the power consumption and performance of constituent components, such as latches. Latches are ubiquitous in many modern synchronous systems. Consequently, high-speed latches that exhibit minimal current leakage and associated power consumption are desirable.

To address leakage concerns, High Voltage Threshold transistors (HVT's) are often employed. An HVT requires a relatively high voltage at the transistor gate to turn on the transistor to enable a conduction path through the transistor. When an HVT is off, little or no current flows through the transistor. Consequently, HVT's exhibit minimal current leakage. Unfortunately, HVT's turn on relatively slowly. Consequently, latches employing primarily HVT's exhibit good leakage characteristics but are typically slow, which reduces the performance of the entire synchronous digital system.

To address performance concerns, Low Voltage Threshold (LVT) transistors are often employed. LVT's turn on relatively quickly with minimal gate voltage. However, LVT's are often leaky. Consequently, latches and associated systems employing LVT's are often leaky.

A tradeoff exists between low leakage and high performance. Generally, high performance latches exhibit high current leakage during sleep mode. Low performance latches exhibit low leakage during sleep mode.

To achieve both acceptable performance and low leakage, engineers have developed hybrid latches that employ a combination of selectively placed HVT's and LVT's. Unfortunately, to achieve acceptable performance and leakage characteristics, these hybrid latches require that the synchronizing clock sleeps low such that clock is low when the latch is in sleep mode or that the synchronizing clock sleeps high such that the clock is high when the latch is in sleep mode.

If the hybrid latch is designed so that the clock sleeps high, an HVT pass gate is typically positioned before an LVT pass gate in the data path. The resulting latch exhibits an undesirably lengthy setup time and a short transition delay. The setup time is the time delay between stabilization of an input and the triggering edge of the synchronizing clock. The transition delay is the time interval between the triggering edge of the clock and the stabilization of the latch output. When referring to a D flip-flop latch, also called a delay flip-flop or a DQ flip-flop, the transition delay is often called the clock-to-Q delay, where Q represents the latch output.

The lengthy setup time results from the slow HVT pass gate. The clock signal that controls the LVT pass gate must wait for the input to arrive at the LVT pass gate via the slow HVT pass gate, yielding a long setup time. The minimal transition delay results from the fast LVT pass gate, which minimizes the delay between the input of the LVT pass gate and the output of the latch.

If the hybrid latch is designed so that the clock sleeps low, an LVT pass gate is typically positioned before the HVT pass gate in the data path. The resulting latch exhibits a short setup time and an undesirably lengthy transition delay. The short setup time results from the fast LVT pass gate. The lengthy transition delay results from the slow HVT pass gate.

Conventionally, a tradeoff exists between setup time and transition delay. Conventional hybrid latches require that the clock either sleep high or low, causing a lengthy setup time or transition delay, respectively. Furthermore, the requirement that the clock either sleep high or low limits the applicability of these latches to certain applications not requiring latches to selectively sleep high and/or low.

Hence, a need exists in the art for a system that minimizes leakage in integrated circuits during sleep mode without compromising performance. There exist a further need for an associated high-performance latch that can selectively sleep high or low; exhibits both minimal setup time and transition delay; and that minimizes current leakage during sleep mode.

SUMMARY OF THE INVENTION

The need in the art is addressed by the system for reducing current leakage in an integrated circuit of the present invention. In the illustrative embodiment, the inventive system is adapted for use with Complementary Metal Oxide Semiconductor (CMOS) latches. The system includes a first circuit component and a second circuit component in a path between a relative high voltage and a relatively low voltage. A mechanism selectively provides feedback from an output of the second circuit component to an input of the first circuit component to selectively cutoff the path at the first circuit when the path is not cutoff at the second circuit.

In a more specific embodiment, the mechanism further includes a mechanism for preserving data in the integrated circuit. The mechanism for preserving data in the integrated circuit includes a multiplexer for selectively enabling the feedback when the integrated circuit is in sleep mode. The multiplexer is a 2-1 multiplexer having a shift input as a control input and having scan-in and feedback inputs.

The first and second circuit components are CMOS inverters. The feedback path is chosen so that when the feedback path is activated, a high state occurring at an input of the second CMOS inverter results in a high state at an input of the first CMOS inverter. Similarly, a low state occurring at an input of the second CMOS inverter results in a low state at an input of the first CMOS inverter. This serves to cutoff leakage paths through the CMOS inverters when the feedback is enabled, such as during sleep mode of an accompanying latch. In the illustrative embodiment, the integrated circuit is a master-slave D flip-flop.

The novel design of the present invention is facilitated by the feedback from the output of the second circuit component to the input of the first circuit component when the associated latch or other circuit is in sleep mode. This minimizes leakage during sleep mode without compromising the performance of the accompanying latch. Minimizing leakage during sleep mode by strategically feeding back slave half-latch data to the master cell when the latch is in sleep mode eliminates conventional tradeoffs between low leakage and high performance and between setup time and transition delay. The present invention enables low-leakage latches without compromising performance and enables short setup times without compromising transition delay and visa versa. Furthermore, the clock may either sleep high or low without compromising leakage or performance characteristics. This increases the versatility, performance, and leakage characteristics of latches incorporating the system for reducing leakage of the present invention.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The following discussion of a conventional master-slave D flip-flop latch is intended to facilitate an understanding of the present invention.

Figure 1:
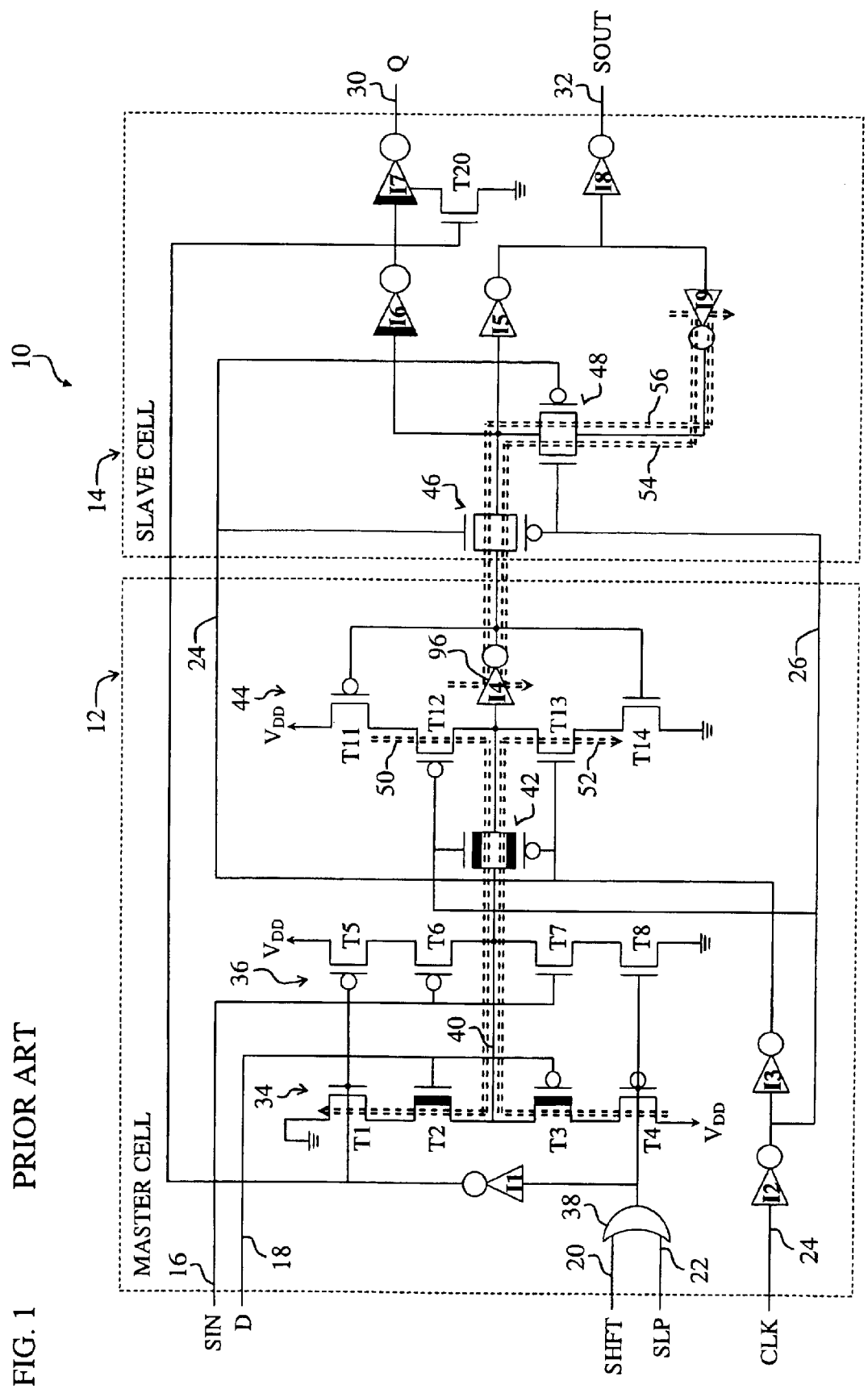
FIG. 1 is a diagram of a conventional latch requiring that the clock must sleep low.

FIG. 1 is a diagram of a conventional master-slave D flip-flop latch 10 requiring that the clock must sleep low. For clarity, various well-known components, such as power supplies, substrates, and so on, have been omitted from the figures, however those skilled in the art with access to the present teachings will know which components to implement and how to implement them to meet the needs of a given application.

The latch 10 includes a master cell 12 in series with a slave cell 14. The master cell 12 has five inputs, including a scan-in input (SIN) 16, a data input (D) 18, a shift input (SHIFT) 20, a sleep input (SLP) 22, and a clock input (CLK) 24. The master cell 12 provides master cell output 28 to the slave cell 14. The slave cell 14 also receives an inverted clock signal 26 as input and provides a data output (Q) 30 and a scan output 32.

The master cell 12 includes a first column of transistors 34 and a second column of transistors 36 that act as selectively gated inverters, as discussed more fully below. The first column of transistors 34 includes, from top to bottom, a first High Voltage Threshold (HVT) NMOS (N-channel Metal Oxide Semiconductor) transistor T1, a second Low Voltage Threshold (LVT) NMOS transistor T2, a third LVT PMOS (P-channel Metal Oxide Semiconductor) transistor T3, and a fourth HVT PMOS transistor T4. The transistors T1–T4 are connected so that the source of the fourth PMOS transistor T4 is connected to a high voltage state (Vdd), which is typically provided via a DC voltage source (not shown). The drain of the PMOS transistor T4 is connected to the source of the third PMOS transistor T3. The drain of the third PMOS transistor T3 is connected to the drain of the second NMOS transistor T2. The source of the second NMOS transistor T2 is connected to the drain of the first NMOS transistor T1. The source of the first transistor NMOS transistor T1 is connected to a low voltage state, such as ground. Hence, the first column of transistors 34 are connected so that if the transistors T1–T4 were all on, current would flow from the high voltage state to the low voltage state from the source of the fourth PMOS transistor T4 through to the source of the first NMOS transistor T1.

The second column of transistors 36 includes, from top to bottom, a fifth PMOS transistor T5, a sixth PMOS transistor T6, a seventh NMOS transistor T7, an eighth NMOS transistor T8. The source of the fifth PMOS transistor T5 is connected to the high voltage state Vdd, and the drain is connected to the source of the sixth PMOS transistor T6. The drain of the sixth PMOS transistor T6 is connected to the drain of the seventh NMOS transistor T7. The source of the seventh NMOS transistor T7 is connected to the drain of the eighth NMOS transistor T8. All of the transistors T5–T8 of the second column 36 are HVT transistors, which are characterized by low leakage, but relatively slow turn-on times.

The shift input 20 and the sleep input 22 of the master cell 12 are input to an OR gate 38. The output of the OR gate 38 is connected to the input of a first HVT inverter I1; to the gate of the fourth HVT PMOS transistor T4 in the first column of transistors 34; and to the gate of the eighth NMOS transistor T8 in the second column of transistors 36. The output of the first inverter I1 is connected to the gate of the first HVT NMOS transistor T1 and to the gate of the fifth HVT PMOS transistor T4.

The data input 18 is connected to the gate of the second LVT NMOS transistor T2 and to the gate of the third LVT PMOS transistor T3. The scan-in input 16 is connected to the gate of the sixth HVT PMOS transistor T6 and the gate of the seventh HVT NMOS transistor T7.

The drains of the second NMOS transistor T2, the third PMOS transistor T3, the sixth PMOS transistor T6, and the seventh NMOS transistor T7 are connected at a common node 40. The common node 40 is connected to the input of an initial LVT pass gate 42.

A third column of transistors 44 includes, from top to bottom, an eleventh HVT PMOS transistor T11, a twelfth HVT PMOS transistor T12, a thirteenth HVT NMOS transistor T13, and a fourteenth HVT NMOS transistor T14. The drains and sources of the transistors T11–T14 of the third column of transistors 44 are connected similarly to the drains and sources of the transistors T5–T8 of the second column of transistors 36. The source of the eleventh PMOS transistor T11 is connected to Vdd, while the source of the fourteenth NMOS transistor T14 is connected to a low voltage state, such as ground. Consequently, if the transistors T11–T14 were on, current would flow relatively freely from Vdd at the source of T11 to ground (or other low voltage state) at the source of T14.

The gate of the twelfth HVT PMOS transistor T12 is connected to the LVT NMOS portion of the initial pass gate 42 and to the inverted clock signal 26 provided via a second HVT inverter I2. The gate of the thirteenth HVT NMOS transistor T13 is connected to the LVT PMOS portion of the initial pass gate 42 and to the clock signal 24 via the output of a third inverter I3, which is connected in series with the second inverter I2.

The output of the LVT pass gate 42 is connected to the input of a fourth inverter I4 and to the drains of the twelfth HVT PMOS transistor 12 and the thirteenth HVT NMOS transistor T13. When the initial pass gate 42 is on, the output of the pass gate 42 connects to the common note 40.

The gates of the eleventh HVT PMOS transistor T11 and the fourteenth HVT NMOS transistor T14 are connected to the output of the fourth inverter I4 and to the input of a second HVT pass gate 46. The output of the second HVT pass gate 46 is connected to a first terminal of a third HVT pass gate 48 and to the inputs of a fifth HVT inverter I5 and a sixth LVT inverter I6. The output of the sixth LVT inverter I6 is input to a seventh LVT inverter I7. The output of the seventh LVT inverter I7 represents the Q output 30. The sixth LVT inverter I6 and the seventh LVT inverter I7 are selectively grounded or connected to a low voltage state via a last-stage HVT NMOS transistor T20. Consequently, I6 and I7 only operate as inverters when a sufficiently high voltage state exists at the gate of the last-stage HVT NMOS transistor T20. The gate of the last-stage HVT NMOS transistor T20 is connected to the output of the first inverter I1 in the master cell 12. Consequently, the Q output 30 is enabled when neither the shift input 20 nor the sleep input 22 are high, i.e., when both inputs 20, 22 are low. This ensures that the output of the first inverter I1 is high, which turns on the HVT NMOS transistor T20, enabling the inverters I6 and I7. The last stage HVT NMOS transistor T20 helps to reduce leakage when the latch 10 is in sleep mode.

The NMOS portion of the third pass gate 48 is connected to the PMOS portion of the second pass gate and to the inverted clock signal 26 provided via the second HVT inverter I2. Similarly, the PMOS portion of the third pass gate 48 is connected to the NMOS portion of the second pass gate 46, which is connected to the clock signal 24 provided via the output of the third HVT inverter I3.

The output of the fifth HVT inverter I5 is connected to the input of an eighth HVT inverter I8 and to the input of a ninth HVT inverter I9. The output of I9 represents half-latch data (IQ) and is connected to a second terminal of the third pass gate 48. The half latch data (IQ) typically matches the Q output 30 of the latch 10. The output of the eighth HVT inverter I8 represents the scan output (SOUT) 32.

In operation, the latch 10 is restricted to sleeping when the clock signal 24 is low. Suppose that the latch 10 is not sleeping (such that sleep=0) or shifting (such that shift=0). Then the output of the OR gate 38 is low. Transistors T1 and T4 of the first column of transistors 34 are on. Consequently, the first column of transistors 34 is enabled to act as an inverter to invert the data input signal 18 and provide the result at the common node 40.

The transistors T5 and T8 of the second column of transistors 36 are off. Consequently, the selectively enabled inverter implemented via the second column of transistors 36 is disabled. Hence, the scan-in data 16 is not inverted and transferred to the common node 40.

The input data (D) 18 is inverted and provided at the common node 40. When the clock signal 24 is low, the initial pass gate 42 is on. The inverted input data at the common node 40 is then passes through the pass gate 42 and is inverted again via the fourth HVT inverter I4. The output of the fourth inverter I4 corresponds to the data input 18, which is latched by the latch 10 and represents the master cell output 28.

When the clock signal transitions to a high state, the first pass gate 42 turns off, which latches the data at the output of the forth inverter I4. In addition, the second HVT pass gate 46 turns on, and the third HVT pass gate 48 turns off. The resulting data is then inverted twice by the high-speed LVT inverters I6 and I7 and appears at the Q output 30. The same data is also inverted twice by the HVT inverters I5 and I8 and appears at the scan-out output 32. The same data is also inverted twice by the HVT inverters I5 and I9 and appears as half-latch data at the output of the ninth inverter I9.

The operation of the D flip-flop 10 is characterized by the following transition function:

TABLE 1

| Previous State | Input D(t − 1) | |
|---|---|---|
| Q(t − 1) | 0 | 1 |
| 0 | 0 | 1 |
| 1 | 0 | 1 |
| | New State Q(t) | |

A similar transition function exists for the scan-in input 16 and the scan-out output 32. However, the scan-in input 16 is only latched when the shift or sleep inputs 20, 22 are high.

The clock signal 24 of the latch 10 must sleep low. When the clock signal 24 sleeps low, the clock signal 24 is low (0) when the sleep input 22 to the OR gate 38 is high (1), and consequently, the output of the OR gate 38 is high. When the clock signal 24 is low, the output of the third HVT inverter I3 is low, and the output of the second HVT inverter I2 is high. This causes the initial pass gate 42 to turn on; the second pass gate 46 to turn off; the third pass gate 48 to turn on; and causes the twelfth PMOS transistor T12 and the thirteenth NMOS transistor T13 in the third column of transistors 44 to turn off.

When the latch 10 is sleeping low (clock signal 24 sleeps low), various leakage paths (shown dashed) exist, including a first leakage path 50 from Vdd at the source of the eleventh PMOS transistor T11; through the twelfth PMOS transistor T12, which is off; back through the initial LVT pass gate 42; and then to ground via the second LVT NMOS transistor T2 and the first HVT transistor T1, which is off. This leakage path 50 flows through two off HVT transistors, namely T12 and T1, and consequently, the leakage is low through the leakage path 50 when the latch 10 is in sleep mode (clock sleeping low).

A second leakage path 52 exists from Vdd at the source of the fourth HVT PMOS transistor T4, which is off; through the third LVT PMOS transistor T3, through the initial pass gate 42; and then to ground via the thirteenth HVT transistor 13, which is off, and via the fourteenth HVT NMOS transistor T14. The second leakage path 52 flows through two off LVT transistors, namely T4 and T13, and consequently, the leakage is low.

A third leakage path 54 may exist from Vdd at the fourth HVT inverter I4; through the second HVT pass gate 46, which is off; through the third pass gate 48; and then to ground via the ninth HVT inverter I9. A fourth leakage path 56 flows from Vdd at the ninth HVT inverter I9; through the third HVT pass gate 48; through the off HVT pass gate 46; and to ground via the fourth HVT inverter I4. Consequently, all leakage paths 50–56 flow through off HVT transistors, thereby minimizing leakage.

In the latch 10 of FIG. 1, the clock must sleep low, since the initial pass gate 42 is implemented via LVT transistors. If the clock signal 24 slept high, unacceptable leakage would result through the initial pass gate 42. For example, a leakage path could exist from Vdd at the source of the fifth HVT PMOS transistor T5; through the off LVT pass gate 42; and to ground via the fourth HVT inverter I4. The only off transistors in the leakage path would be LVT transistors of the initial LVT pass gate 42. Since LVT transistors are leaky, undesirable leakage would result. Additional leakage paths could exist through the initial pass gate 42.

The latch design 10 is restricted to sleeping when the clock signal 24 is high and to having the initial pass gate 42 be an LVT pass gate while the second pass gate 46 be an HVT pass gate. This configuration results in a relatively fast setup time, since the fast LVT pass gate 42 is in the data path between the data input 18 and the input 28 to the slave cell. However, since the second HVT pass gate 46 is slow to turn on in response to the inverted clock signal 26, a lengthy transition delay exists from the input 28 of the slave cell 14 to the Q output 30 of the latch 10.

In an alternative design, the clock signal 24 must sleep high, and the initial pass gate 42 must be implemented as an HVT pass gate, and the second pass gate 46 must be implemented as an LVT pass gate. The alternative design is characterized by a lengthy setup time and a relatively short transition delay.

Unfortunately, the requirement that the clock signal 24 must sleep either high or low places undesirable design constraints on systems incorporating latch designs similar to the latch 10. Furthermore, the requirement that the initial pass gate 42 be either an LVT or HVT pass gate, while the second pass gate 46 be the opposite, compromises either transition delay or setup time performance perimeters, respectively.

Figure 2:
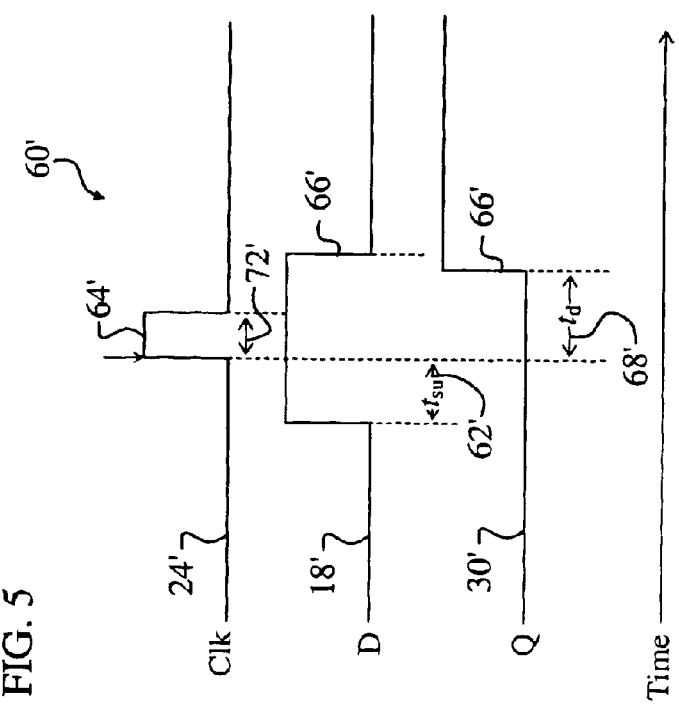
FIG. 2 is a timing diagram for the latch of FIG. 1 illustrating a lengthy transition delay.

FIG. 2 is a timing diagram 60 for the latch 10 of FIG. 1 illustrating a lengthy transition delay ($t_d$) 70. With reference to FIGS. 1 and 2, when the clock signal 24 transitions to a high state at the rising edge of the clock pulse 64, the second HVT pass gate 46 turns on. To latch a high state as represented by the data pulse 66, the pulse 66 of the data signal 18 must be high for a predetermined setup time ($t_{su}$) 62 before the clock signal 24 transitions to the high state at the clock pulse 64. To ensure reliable operation, a minimum setup time is required. The minimum setup time for the latch 10 of FIG. 1 is relatively short due to the fast LVT pass gate 42. A relatively lengthy transition delay ($t_d$) 68 exists between when the clock signal 24 transitions to a high state at the clock pulse 64 and when data pulse 66 appears at the Q output 30.

The clock pulse 64 must have a certain minimum clock pulse width 72 to ensure reliable operation. Use of the slow HVT pass gate 46 in the data path necessitates a relatively lengthy clock pulse with 72. For example, if the clock pulse 64 is too short, the slow HVT pass gate 46 may fail to turn on. A similar latch (not shown), wherein the clock must sleep high, would require a relatively lengthy setup time, a short transition delay, and a relatively wide clock pulse width.

Figure 3:
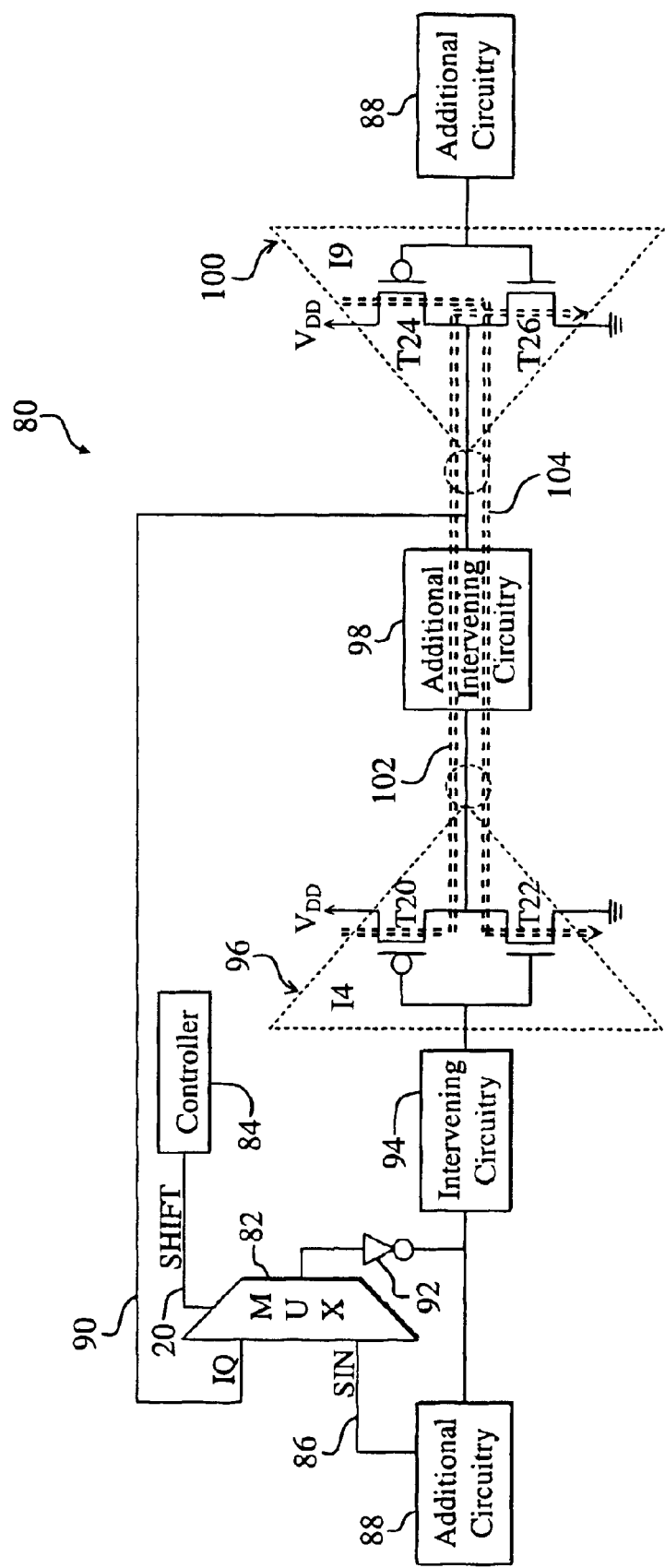
FIG. 3 is a diagram of a system for reducing leakage constructed in accordance with the teachings of the present invention.

FIG. 3 is a diagram of a system 80 for reducing leakage constructed in accordance with the teachings of the present invention. The system 80 may be adapted to various circuits that have more than one inverter through which leakage paths may flow. For example, the system 80 may be adapted to improve leakage and performance characteristics of conventional latches, such as the latch 10 of FIG. 1.

The system 80 includes a 2-1 multiplexer (MUX) 82, a controller 84, additional circuitry 88, a first low-leakage inverter 92, intervening circuitry 94, a second low-leakage inverter 96, additional intervening circuitry 98, and a third low-leakage inverter 100. The MUX 82 receives a control input (SHIFT) 20 from a controller 84. A first MUX input 86 originates from the additional circuitry 88. The additional circuitry 88 may provide an output (SIN) 86 to be scanned into a latch (see FIG. 1). Alternatively, the first MUX input 86 may originate from the controller 84. A second MUX input (IQ) 90 originates from an output of the third low-leakage inverter 100. The input of the third low-leakage inverter 100 originates from the additional circuitry 88, which may represent the last stage of a slave latch (see 14 of FIG. 1). The output of the third low-leakage inverter 100 is also connected to the additional intervening circuitry 98. The additional intervening circuitry 98 is also connected to an output of the second low-leakage inverter 96. An input of the second low-leakage inverter 96 is connected to the intervening circuitry 94, which is also connected to an output of the first low-leakage inverter 92. An input of the first low-leakage inverter is connected to an output of the MUX 82.

The second low-leakage inverter 96 is an HVT CMOS inverter constructed from a first HVT PMOS transistor T20 and a second HVT NMOS transistor T22. Similarly, the third low-leakage inverter 96 is an HVT CMOS inverter constructed from a third HVT PMOS transistor T24 and a fourth HVT NMOS transistor T26. The first low-leakage inverter 92 may correspond to a selectively gated inverter, such as the selectively gated inverter implemented by the second column of transistors 36 of FIG. 1.

In operation, the system for reducing leakage 80 has two operational modes, which are set by the controller 84 via the MUX 82. In a first operational mode, the MUX 82 is disabled. Alternatively, the first MUX input 86 is selected as the output of the MUX 82, and the feedback 90 from the output of the third low-leakage inverter 100 is disabled. In this mode, the intervening circuitry 94, 98; the inverters 92, 96, 100; and the additional circuitry 88 may operate as desired without the half-latch IQ feedback 90. The first mode may correspond to an active mode in a latch.

A second mode, which is a low-leakage mode, may correspond to a sleep mode in a latch. In this mode, the first MUX input 86 is disabled, and the second MUX input 90, which represents feedback from the output of the third low-leakage inverter 100, is selected as the output of the MUX 82.

In the present specific embodiment, a first possible leakage path 102 exists from Vdd at the source of the first HVT PMOS transistor T20 of the second low-leakage inverter 96 through to ground via the additional intervening circuitry 98 and the fourth HVT NMOS transistor T26 of the third low-leakage inverter 100. A second possible leakage path 104 exists from Vdd at the source of the third HVT PMOS transistor T24 of the third low-leakage inverter 100 though to ground via the additional intervening circuitry 98 and the second HVT NMOS transistor T22 of the second low-leakage inverter 96. The first possible leakage path 102 and the second possible leakage path 104 are similar to the fourth leakage path 56 and the third leakage path 54 of FIG. 1, respectively. The feedback 90 enabled via the controller 84 and the MUX 82 ensure that when the system 80 is in low-leakage mode, the leakage paths 102–104 are shut off.

For example, if the input to the third low-leakage inverter 100 is high, the PMOS transistor T24 is off, and the NMOS T26 is on. Consequently, a path to ground is open through the NMOS T26, which ensures that the output of the third low-leakage inverter 100 is low. The low state passes through the MUX 82 via the feedback 90; is inverted by the first low-leakage inverter 92, becoming a high state; and then passes through the intervening circuitry 94, appearing as a high state at the input of the second low-leakage inverter 96. This high state ensures that the NMOS T22 is on, while the PMOS T20 is off. Consequently, the first leakage path 102 from Vdd to ground is cutoff via the first HVT PMOS transistor T20. The second leakage path from Vdd to ground is cut off via the third HVT PMOS transistor T24. Similarly, when the system 80 is in low-leakage mode, if a low state occurs at the input of the third low-leakage inverter 100, a low state will occur at the input of the second low-leakage inverter 96. Consequently, both HVT NMOS transistors T22 and T26 of the inverters 96 and 100, respectively, will be off. Hence, leakage paths 102, 104 from Vdd to ground will be cut off.

The system 80 is configured so that a high state occurring at the input of the third low-leakage inverter 100 will result in a high state occurring at the input of the second low-leakage inverter 96 when the system 80 is in low-leakage mode. Those skilled in the art will appreciate that the feedback 90 may be taken directly from the input of the third low-leakage inverter 100 and the first low-leakage inverter 92, and the intervening circuitry 94 be omitted without departing from the scope of the present invention. Other mechanisms for ensuring that the leakage paths 102 and 104 are cut off via the feedback 90 when the system 80 is in low-leakage mode or sleep mode may be employed without departing from the scope of the present invention. For example, the MUX control input from the controller 84 may be replaced with an input that is a function of a clock signal, and the controller 84 may be omitted. Furthermore, the MUX 82 may be omitted in certain designs. For example, the MUX 82 may be replaced with a controller or other logic that selectively provides the necessary feedback to the second low-leakage inverter 96 when the system 80 is in low-leakage mode. Furthermore, the system 80 may be adapted to circuits, other than latches, that have two or more inverters through which leakage paths may exist during periods when leakage is undesirable, such as during sleep mode.

Figure 4:
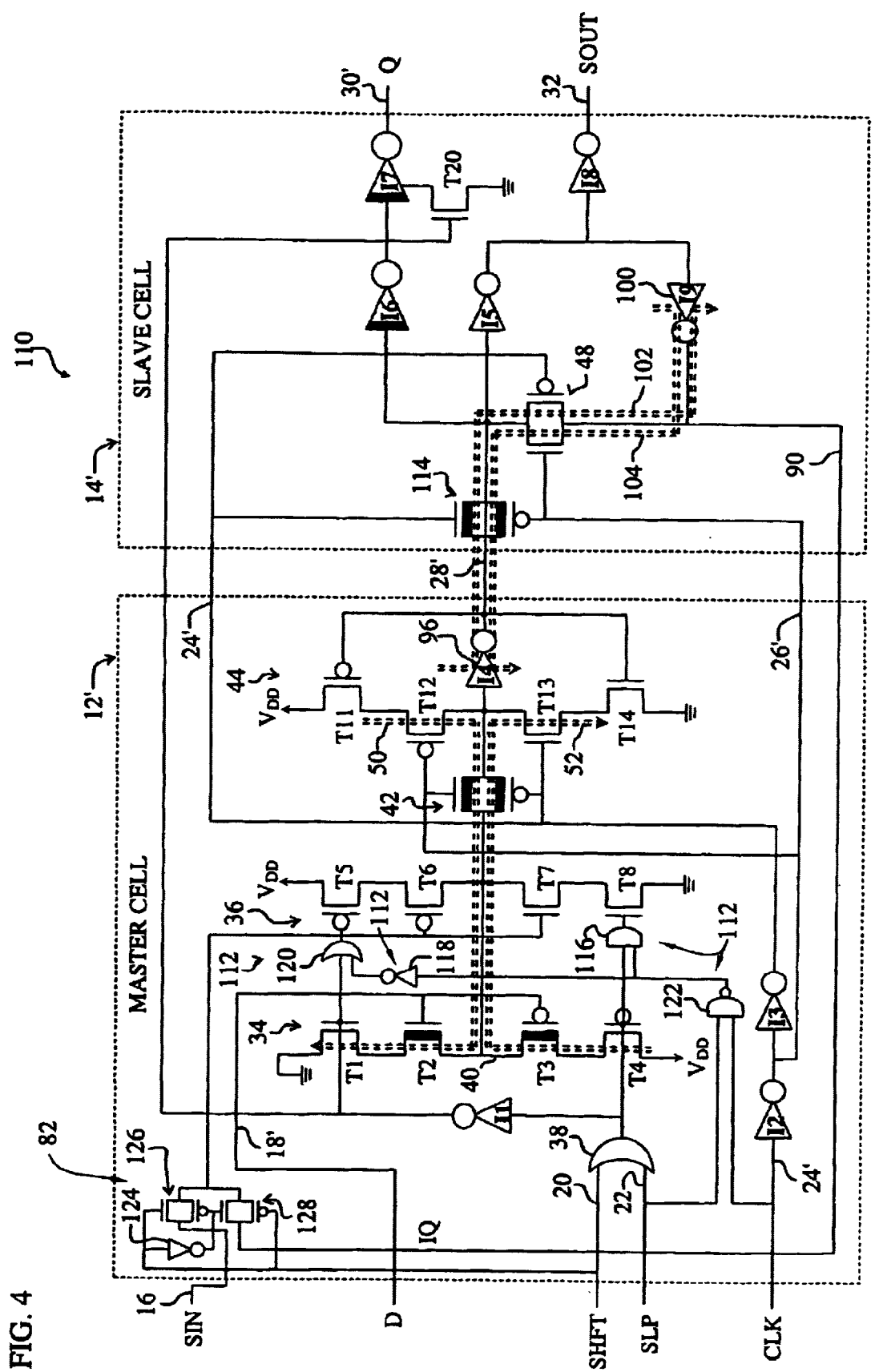
FIG. 4 is a diagram of a high-performance, low-leakage latch constructed in accordance with the teachings of the present invention, which can operate effectively when the clock sleeps high or low, and which incorporates the system for reducing leakage of FIG. 3.

FIG. 4 is a diagram of a high-performance, low-leakage latch 110 constructed in accordance with the teachings of the present invention, which can operate effectively when the clock sleeps high or low, and which incorporates the system 80 for reducing leakage of FIG. 3. The high-performance characteristics of the latch 110 enable the use of a more efficient clock signal 24', inverted clock signal 26', master slave output signal 28', and data signal 18'. The clock signal 24' may have a higher frequency and a narrower pulse width. The data signal 18' may also have a narrower pulse width, which affects the master slave output 28' and the output signal 30', as discussed more filly below.

The construction of the high-performance, low-leakage latch 110 is similar to the construction of the latch 10 of FIG. 1 with the exception that latch 110 of FIG. 4 includes additional logic 112 and includes the MUX 82 in the master cell 12'. In addition, the slow second HVT pass gate 46 of FIG. 1 is replaced with a high-speed LVT pass gate 114. The fourth inverter I4 corresponds to the second low-leakage inverter 96 of FIG. 3. The ninth inverter I9 corresponds to the third low-leakage inverter 100 of FIG. 3. Furthermore, the output 90 of the ninth HVT inverter I9 is fed back to the input of the MUX 82.

The additional logic 112 includes a NAND gate 122, which receives the efficient clock signal 24' and the sleep signal 22 as input and provides output to an AND gate 116 and to an additional inverter 118. The AND gate 116 receives an additional input from the output of the OR gate 38. An output of the AND gate 116 is connected to the gate of the eighth HVT NMOS transistor T8. The output of the additional inverter 118 is input to an additional OR gate 120. The additional OR gate 120 receives a second input from the output of the first HVT inverter I1 and provides output to the gate of the fifth HVT PMOS transistor T5.

The pass gates 114 and 48 of FIG. 4 correspond to the additional intervening circuitry 98 of FIG. 3. The third column of transistors 44 and the LVT pass gate 42 correspond to the intervening circuitry 94 of FIG. 3. The second column of transistors 36 acts as a selectively gated inverter and corresponds to the initial HVT inverter 92 of FIG. 3. The remaining circuitry corresponds to the additional circuitry 88 of FIG. 3. The output of the MUX 82 is connected to the second column of transistors 36 similarly to how the scan-in input 16 of FIG. 1 is connected to the second column of transistors 36.

In operation, half-latch data corresponding to the feedback 90 is fed back from the slave cell 14' to the MUX 82 when the latch 110 is in sleep mode. The mode of the latch 110, such as whether the clock signal 24' sleeps high or low, may be determined automatically via the sleep input 22 and the shift input 20, which may be controlled by a controller, such as the controller 84 of FIG. 3. By selectively controlling the sleep and shift inputs 20, 22, the latch 110 may be automatically enabled to sleep when the clock signal 24' is high or low. This is unlike conventional latches, which are hard wired to either sleep when the synchronizing clock signal 24' is high or sleep when the synchronizing clock signal 24' is low.

The feedback 90 is transferred through to the output of the MUX 82. The inverters T6 and T7 in the second column of transistors 36 then invert the data at the output of the MUX 82. The inverted feedback data then propagates to the input of the second low-leakage inverter 96. This ensures that the leakage paths through the low-leakage inverters (I4, I9) 96, 100 are cutoff via one of the HVT transistors in the inverters 96, 100 during sleep mode. Consequently, the second pass gate 46 of FIG. 1 may be replaced with the high-speed LVT pass gate 114 of FIG. 4, since leakage through the second pass gate 46 is no longer a concern. Hence, the latch 110 will exhibit low leakage, a rapid setup time, a rapid transition delay, and a minimum required clock pulse width due to the high-speed gates 42, 114 in the data path.

The additional logic 112 ensures that when the clock signal 24' sleeps high that the end transistors T5 and T8 of the second column of transistors 36 are off and that when the clock signal 24' sleeps low that the end transistors T5 and T8 are on. This ensures that, for example, when the clock signal 24' sleeps high, any leakage from Vdd at the low-leakage inverter 96 through to ground via the first LVT pass gate 42, the seventh HVT NMOS transistor T7, and the eighth HVT NMOS transistor T8 of the second column of transistors 36 is cutoff via off HVT NMOS transistor T8. Furthermore, any leakage path from Vdd at the source of the off fifth HVT PMOS transistor T5 through the sixth HVT PMOS transistor T6 and the first LVT pass gate 42 to ground at the low-leakage inverter 96 is cutoff.

When the clock signal 24' sleeps high, no slave half latch feedback 90 is required, since the third HVT pass gate 48 is automatically off. This blocks the leakage paths 102 and 104. Hence, the leakage paths 102, 104 through the low-leakage inverters 96, 100 do not require blocking at the inverters 96, 100, since they are blocked at the third HVT pass gate 48.

When the clock signal 24' sleeps high, the transistors T5 and T8 of the second column of transistors 36 are off due to the additional logic 112 and the fact that both the clock signal 24' and the sleep signal 22 are high. Consequently, the selectively gated inverter implemented by the second column of transistors 36 is disabled. Hence, the slave half latch feedback 90 is selectively disabled.

When the clock signal 24' sleeps low, any leakage paths (not shown) from Vdd at transistor T5 of second column of transistors 36 to ground are cutoff. In this case, either T6 or T7 is cutoff. If T6 is off, leakage paths from Vdd at transistor T5 are blocked via the off HVT transistor T7. If T6 is on, T7 is off, and the leakage paths remain cutoff, since the node 40 is isolated from ground. The node 40 is isolated from ground by off transistors T7, T13, T1, T13, and the off NMOS transistor T22 (see FIG. 3) of the low leakage inverter 96.

When the clock signal 24' sleeps low, HVT transistors T12 and T13 in the third column of transistors 44 are off. Consequently, any leakage paths through the third column of transistors 44 and through the first HVT pass gate 42 are cutoff via the off HVT transistors T12, T13.

When the clock sleeps high or low, the end transistors T1 and T4 of the first column of transistors 34 are off. Consequently, any leakage paths from the source of T4 are cutoff, and any leakage paths through to ground via T1 are cutoff when either the clock sleeps high or low. Furthermore, when the clock sleeps high or low, leakage paths through the low-leakage inverters 96 and 100 are cutoff due to the half-latch feedback 90 to the MUX 82 in accordance with the system 80 of FIG. 3.

Hence, all leakage paths in the latch 110 are cutoff when the clock signal 24' sleeps high and when the clock signal 24' sleeps low. Furthermore, the latch 110 employs high-speed pass gates 42, 114 in the data path, which significantly improves the performance of the latch 110. Hence, the latch 110 is a high-performance latch that exhibits low leakage when the clock signal 24' sleeps high or when the clock signal 24' sleeps low.

Those skilled in the art will appreciate that various modifications to the latch 110 may be made to meet the needs of a given application without departing from the scope of the present invention. For example, the fifth HVT inverter I5 and the eight HVT inverter I8 may be replaced with LVT inverters. In this case, an additional last stage transistor (not shown), such as the transistor T20 used for the slave LVT inverters I6, I7, would be included with the inverters I5, I8 to ensure that leakage is minimized during sleep mode. Furthermore, the scan-in and scan-out functionality of the latch 110 may be omitted without departing from the scope of the present invention.

In the present specific embodiment, the MUX 82 is implemented via an additional MUX inverter 124 and additional HVT pass gates 126 and 128. Other MUX implementations may be employed without departing from the scope of the present invention. Those skilled in the art will appreciate that the details of the implementation of the MUX 82 are application-specific and that different MUX implementations may be employed to meet the needs of different applications. Furthermore, the MUX 82 may be omitted or replaced with another device, such as a controller, without departing from the scope of the present invention.

Figure 5:
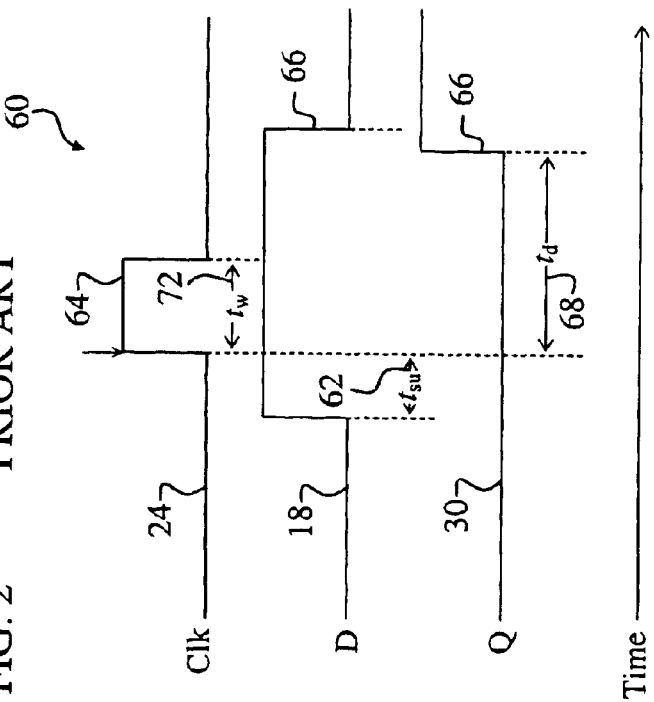
FIG. 5 is a timing diagram for the latch of FIG. 4 illustrating the short setup time and transition delay.

FIG. 5 is a timing diagram 60' for the latch 10 of FIG. 4 illustrating the relatively short setup time 62', transition delay 68', and clock pulse width 72'. The latch 110 of FIG. 4 can accommodate a higher frequency clock signal 24' with a narrower clock pulse 64' and more efficient data input and output signals 18', 30' with narrower data pulses 66'. Hence, comparing the timing diagrams 60 and 60' of FIG. 2 and FIG. 5, respectively, high-speed latch 114 of FIG. 4 exhibits significantly better performance than the latch 10 of FIG. 1.

Figure 6:
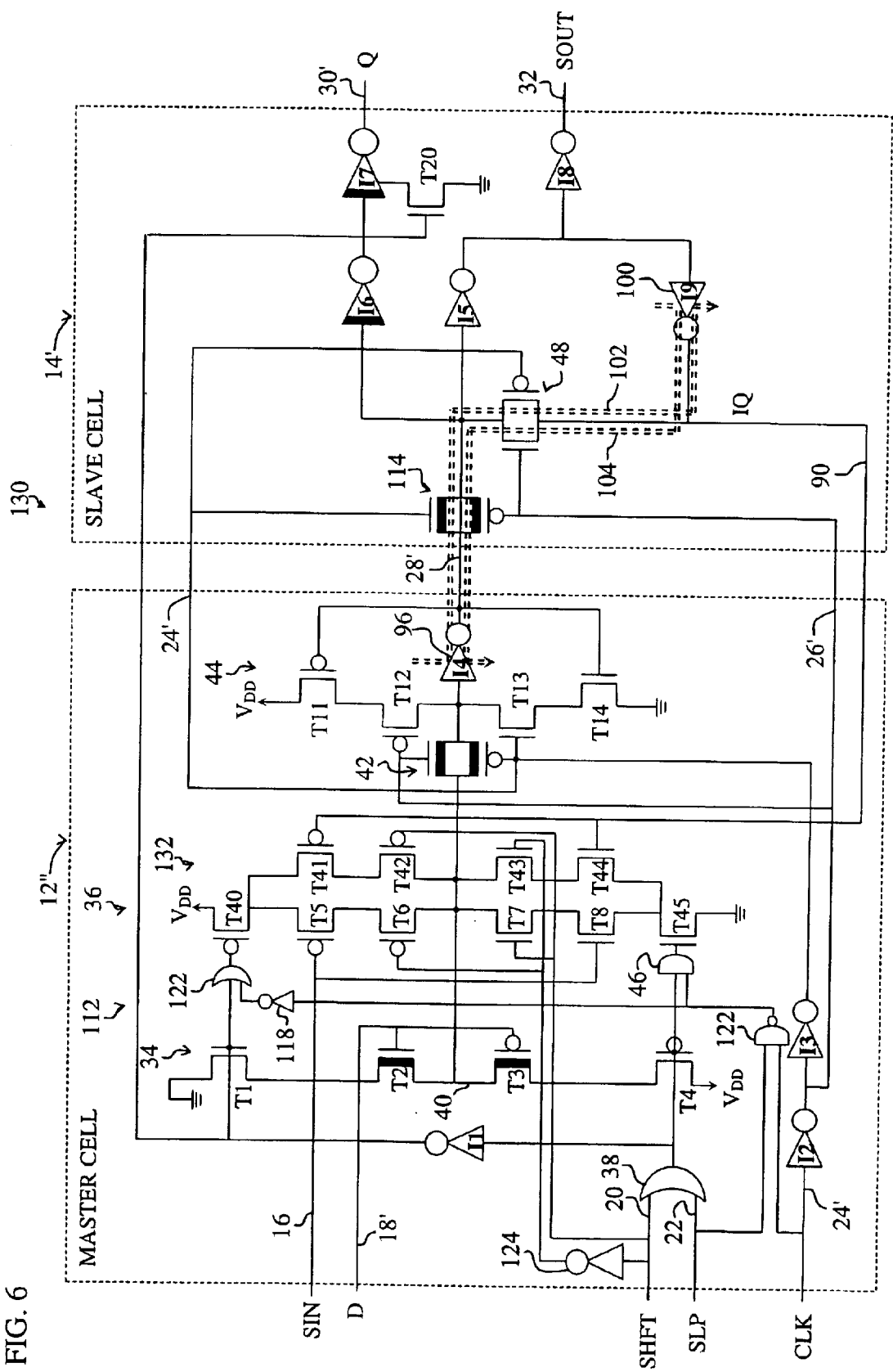
FIG. 6 is a diagram of a first alternative embodiment the latch of FIG. 4 incorporating a complex gate implementation.

FIG. 6 is a diagram of a fist alternative embodiment 130 of the latch 110 of FIG. 4 lacking the MUX 82 but employing an integrated MUX implemented, in part, via a set of additional HVT transistors 132. The MUX implemented via the transistors 132 is integrated with the master cell 12''. The second column of transistors 36 is fitted with the additional HVT transistors 132, which include, from top to bottom, a fortieth PMOS transistor T40, a forty-first PMOS transistor T41, a forty-second PMOS transistor T42, a forty-third NMOS transistor T43, a forty-fourth NMOS transistor T44, and a forty-fifth NMOS transistor T45. The source of the fortieth transistor T40 is connected to a high voltage state represented by Vdd, while the drain is connected to the source of the fifth transistor T5 and the source of the transistor T41. The PMOS transistor T40–T42 are connected drain-to-source, and the NMOS transistors T43–45 are connected drain-to-source. However, the drain of the forty-second PMOS transistor T42 is connected to the drain of the forty-third NMOS transistor T43. The drain of the forty-fifth NMOS transistor T45 is connected to the source of the transistors T44 and T8.

The additional logic 112 is connected so that the output of the AND gate 116 is connected to the gate of the forty-fifth PMOS transistor T45. The output of the OR gate 120 is connected to the gate of the fortieth PMOS transistor T40. The half-latch data feedback 90 is connected to the gates of transistors T41 and T44. The scan-in input 16 is connected to the gates of transistors T5 and T8. The shift input 20 is connected to the gates of transistors T7 and T42. The shift signal 20 is inverted via the MUX inverter I24 and then input to the gates of transistors T6 and T43.

The operation of the latch 130 is similar to the operation of the latch 110 of FIG. 4 with the exception that the functionality of the MUX 82 of the latch 110 of FIG. 4 is implemented via the columns of transistors 36 and the MUX inverter 124 of the latch 130 of FIG. 6. When the latch 130 is in sleep mode, the half-latch feedback 90 ensures that the leakage paths through the inverters (I4) 96 and (I9) 100 are cutoff. Hence, the pass gates 42 and 114 may be implemented as high-speed LVT pass gates without comprising leakage characteristics.

Note that the SIN signal 16 and the SOUT signal 32 may be omitted without departing from the scope of the present invention. The integrated MUX implementation employed by the latch 130 is relatively compact, since many transistor sources and drains are shared.

Figure 7:
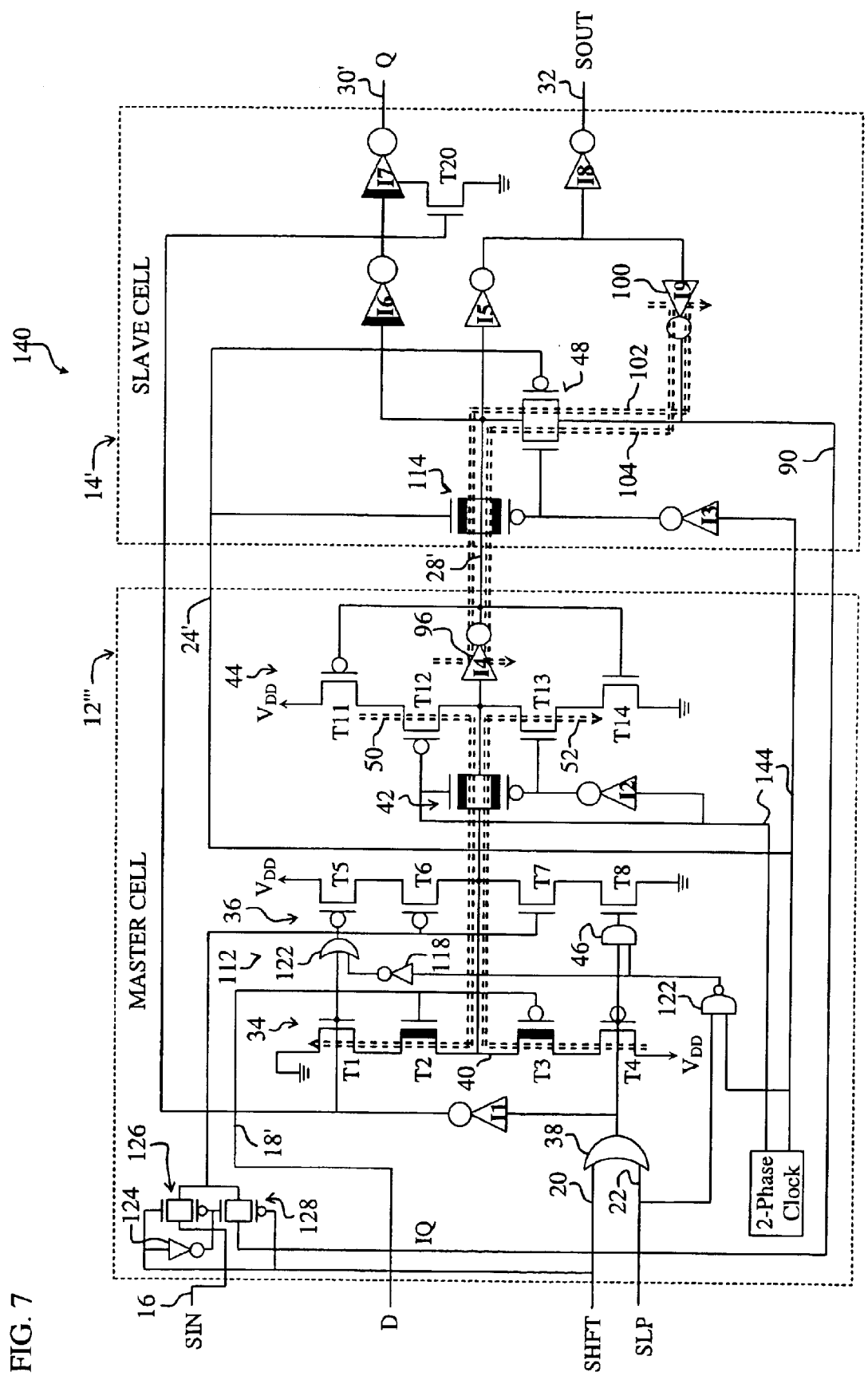
FIG. 7 is a second alternative embodiment of the latch of FIG. 4 adapted for use with a two-phase clock.

FIG. 7 is a second alternative embodiment 140 of the latch 110 of FIG. 4 adapted for use with a two-phase clock 142. The latch 140 of FIG. 7 is similar to the latch 110 of FIG. 4 with the exception that two clock signals 144 having different phases, instead of the clock signal 24' and inverted clock signal 26' of FIG. 4, are employed to selectively turn on the pass gates 42, 114, and 48.

The novel use of the feedback 90 reduces leakage in the latch 140 regardless of whether single phase or dual phase clocking is employed and regardless of which multiplexing scheme is employed to selectively control the feedback 90.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

What is claimed is:

1. A system for reducing leakage through an electrical path in an integrated circuit comprising:
   a first circuit component in said path;
   a second circuit component in said path; and
   means for selectively providing feedback from an output of said second circuit component to an input of said first circuit component to selectively cutoff said path at said first circuit component when said path is not cutoff at said second circuit component, wherein said means for selectively providing feedback further includes a multiplxer configured to preserve data in said circuit and selectively enable said feedback when said circuit is in the sleep mode.

2. The system of claim 1 wherein said multiplexer is a 2-1 multiplexer having a shift input as a control input and having a scan-in input as one input and said feedback as a second input.

3. The system of claim 1 wherein said first circuit component is a first Complementary Metal Oxide Semiconductor (CMOS) inverter, and wherein said second circuit component is a second CMOS inverter.

4. The system of claim 3 wherein said feedback is provided over a feedback path which is chosen so that when said feedback is enabled, a high state occurring at an input of said second CMOS inverter results in a high state at an input of said first CMOS inverter, and a low state occurring at an input of said second CMOS inverter results in a low state at an input of said first CMOS inverter.

5. The system of claim 3 wherein said integrated circuit is a master-slave latch.

6. The system of claim 5 wherein when said latch sleeps when a synchronizing clock signal of said latch is high, additional logic shuts off an additional leakage path in a master cell of said latch via High Voltage Threshold (HVT) transistors that are positioned in a selectively gated inverter in said master cell.

7. The system of claim 6 further including means for selectively disabling said feedback when said clock signal sleeps high, and wherein said additional logic is positioned to block said additional leakage path.

8. The system of claim 7 further comprising means for selectively blocking said path including an HVT pass gate positioned between said first circuit component and said second component when said clock signal sleeps high.

9. A latch comprising:
   a clock signal;
   a circuit containing LVT and HVT transistors arranged so that data is selectively transferred from an input of said latch to an output of said latch in response to said clock signal; and
   means for employing feedback within said circuit to block leakage paths through one of said LVT transistors in said circuit via one or more of said HVT transistor when said circuit is in sleep mode.

10. The latch of claim 9 wherein said LVT transistors are arranged to minimize setup time and transition delay of said latch when said latch is in operating mode.

11. The latch of claim 10 wherein said means for employing feedback blocks leakage turning off said one or more of said HVT transistors when said circuit is in the sleep mode.

12. The latch of claim 11 wherein said circuit includes a master cell and a slave cell, said feedback occurring from said slave cell to said master cell.

13. The latch of claim 12 wherein said feedback represents half-latch data from said slave cell.

14. The latch of claim 13 further including a shift signal, said shift signal indicating when said circuit is in sleep mode.

15. The latch of claim 10 where said latch lacks HVT pass gates in a data path from said input to said output and includes two LVT pass gates in said data path.

16. The latch of claim 15 wherein one of said LVT pass gates is included in a master cell of said latch, and a second LVT pass gate is included in a slave cell of said latch.

17. The latch of claim 16 wherein the leakage paths of said latch flow through off HVT transistors when said latch is in sleep mode.

18. The latch of claim 17 further including means for automatically enabling said latch to sheep when said clock signal of said latch is high or low.

19. The latch of claim 18 wherein when said latch sleeps when said clock signal is high, additional logic shuts off another leakage path in said master cell via said HVT transistors that are positioned in a selectively gate inverter in said master cell.

20. The latch of claim 19 further including means for selectively disabling said feedback when said clock signal sleeps high, and wherein said additional logic is positioned to block said additional leakage path.

21. The latch of claim 18 wherein said means for automatically enabling includes a multiplexer in communication with a controller for selectively controlling said feedback.

22. The latch of claim 21 wherein said multiplexer is integrated with said master cell.

23. The latch of claim 18 wherein said synchronizing clock signal includes two synchronizing clock signals having different phases.

* * * * *